United States Patent
Vega Ordonez

(10) Patent No.: US 6,687,163 B2
(45) Date of Patent: Feb. 3, 2004

(54) SEMICONDUCTOR MEMORY ARRANGEMENT

(75) Inventor: Esther Vega Ordonez, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/164,190

(22) Filed: Jun. 6, 2002

(65) Prior Publication Data

US 2003/0011003 A1 Jan. 16, 2003

(30) Foreign Application Priority Data

Jun. 6, 2001 (DE) .......................... 101 27 371

(51) Int. Cl.$^7$ ............................................ G11C 11/34
(52) U.S. Cl. ..................... 365/185.21; 365/63
(58) Field of Search ............... 365/185.21, 63

(56) References Cited

U.S. PATENT DOCUMENTS

| 5,917,745 A | * | 6/1999 | Fujii | 365/63 |
| 6,088,276 A | | 7/2000 | Ukita | 365/207 |
| 6,337,820 B1 | * | 1/2002 | Hatakeyama | 365/201 |

* cited by examiner

*Primary Examiner*—M. Tran
(74) *Attorney, Agent, or Firm*—Peter F. Corless; Steven M. Jensen; Edwards & Angell, LLP

(57) ABSTRACT

To reduce the total bit-line capacitance in a semiconductor memory arrangement, it is proposed that the semiconductor memory arrangement be so divided into a plurality of memory blocks (9) that each memory block (9) has a corresponding data bus and a group of sense amplifiers (1) connected to this data bus (2) associated with it. In this way it is possible for the bus-line capacitance ($C_B$), which contributes to the total bit-line capacitance, to be reduced because the bus-line capacitance then depends simply on the length of a memory sector (6).

8 Claims, 2 Drawing Sheets

SEMICONDUCTOR MEMORY ARRANGEMENT

The present invention relates to a semiconductor memory arrangement having a plurality of memory sectors which in turn comprise a plurality of storage locations, the storage locations in each memory sector being connectable via a local bit line to a global bit line and it being possible for the digital information stored at the storage locations to be read out and emitted via the appropriate global bit line by a sense amplifier.

A semiconductor memory arrangement of this kind having a hierarchical bit-line structure of this kind is known from EP 0 905 701 A2 for example. In this printed publication it is proposed that the storage locations of the semiconductor memory arrangement be arranged in rows and columns as a matrix, in which case local bit lines (LBL) in the columns are connected directly to the storage locations while a global bit line (GBL) is connected directly to a sense amplifier and, via suitable electronic switches, can be selectively connected to the appropriate local bit lines. To allow a storage location connected to a given local bit line to be read, the electronic switch which connects this local bit line to the global bit line is closed while the other switches in the relevant column of the semiconductor memory arrangement are opened. Each local bit line may for example be connected to several hundred storage locations.

For non-volatile memories, such as EEPROM memories (electrically erasable programmable read-only memories) or flash memories, there is a demand for high storage density, short access time, high operating frequency and low current consumption.

However, an increase in storage density involves an unwanted increase in the bit-line capacitance.

Figure 2:
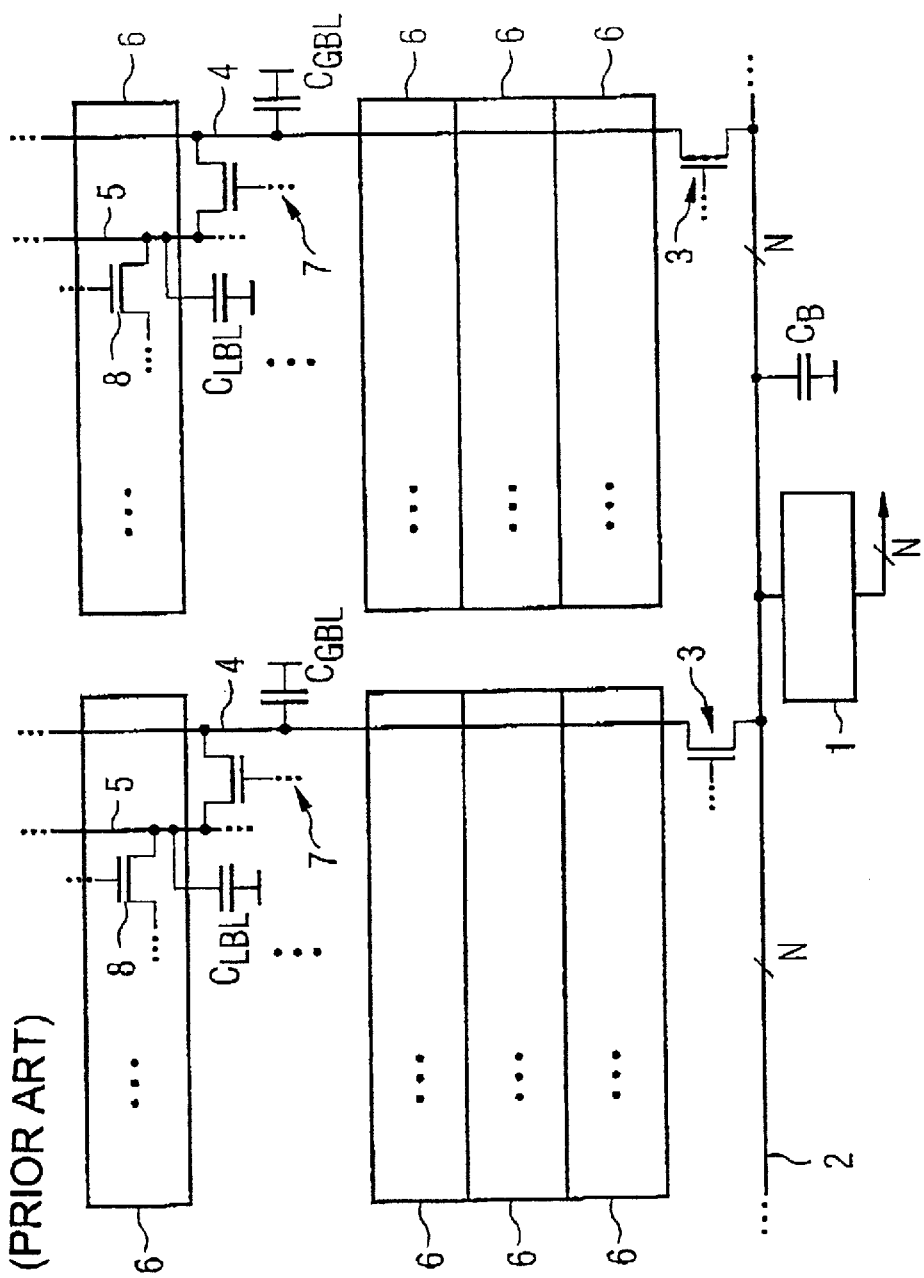

A prior-art semiconductor memory arrangement is shown by way of example in FIG. 2.

As is shown in FIG. 2, the semiconductor memory arrangement is divided into a plurality of memory sectors 6 which in turn contain a plurality of storage locations 8. Each storage location 8 is directly connected to a local bit line 5. Each local bit line 5 is connected to a corresponding global bit line 4 via a corresponding controllable switch 7, which is in the form of a switchable transistor in the present case. As shown in FIG. 2, the individual memory sectors 6 are arranged in columns and rows as a matrix, with a plurality of the global bit lines shown in FIG. 2 generally being provided as common to the memory sectors arranged in a column of the semiconductor memory arrangement, or rather to the storage locations 8 in the sectors. To allow data to be programmed to or read out from the individual storage locations 8, there is a central N-bit data bus 2 provided, it being possible for each of these N data-bus lines to be connected to a desired global bit line 4 via an electronically controllable switch 3, which is once again in the form of a switching transistor in the present case. In addition, each data-bus line in this N-bit data bus 2 is connected to a sense amplifier 1, thus enabling the N sense amplifiers to supply an N-bit output signal.

The individual local bit lines 5 define a local bit-line capacitance $C_{LBL}$, while the individual global bit lines 4 define a global bit-line capacitance $C_{GBL}$. In addition to this, the central read/write data bus 2 produces a bus capacitance $C_B$. The total bit-line capacitance is substantially equal to the sum of the local bit-line capacitance $C_{LBL}$, the global bit-line capacitance $C_{GBL}$ and the bus-line capacitance $C_B$. The total bit-line capacitance depends on, amongst other things, the number of memory sectors 6 and their size. If it is assumed that, to increase storage density, it is merely the number of memory sectors that is increased, then this simply affects the global bit-line capacitance $C_{GBL}$ proportionally to the increase in the number of memory sectors 6. If on the other hand it is assumed that the size of the individual memory sectors 6 is increased as well, this results in an increase in the local bit-line capacitance CAL and bus-line capacitance $C_B$ too, because the size of the memory sectors 6, i.e. their length and width, affect the length of the global bit lines 5 and the length of the central bus line 2 to a corresponding degree.

The individual sense amplifiers 1 are among the most critical components of a non-volatile semiconductor memory and in particular are responsible for ensuring that a sufficiently high stability and read performance are maintained by the semiconductor memory. However, the increase in bit-line capacitance due to the circumstances described above contributes to an appreciable rise in access times, as also does that fact that as technology progresses there is a continuous fall in the current drawn by the location.

The object underlying the present invention is therefore to provide a semiconductor memory arrangement in which the bit-line capacitance is reduced without any appreciable increase in the area occupied.

This object is achieved in accordance with the invention by a semiconductor memory arrangement having the features detailed in claim 1. The subclaims each define preferred and advantageous embodiments of the present invention.

In accordance with the invention, the semiconductor memory arrangement is divided into a plurality of memory blocks, there being provided for each memory block no. i a group of $m_i$ sense amplifiers which is connected to a data bus associated with the given group and which can be connected in this way to corresponding global bit lines. The number of sense amplifiers in each group of sense amplifiers may be the same, in which case, to allow N bits to be read out, the number of data lines in the individual data buses and the number of sense amplifiers associated with each data bus is [[$M_i$=N/n]]$m_i$=N/n (a being the number of memory blocks). In principle, it would of course also be conceivable for the number of sense amplifiers in each sense amplifier group, and hence the number of data lines in each data bus, i.e. the bit-width per bus, to differ from one another, all that needs to be ensured being that $$\sum_{i=1}^{n} m_i = N$$

Because of the division of the semiconductor memory arrangement as described above, the global bit-line capacitance can be appreciably reduced by reducing the number of memory sectors per memory block, assuming that the size of the sectors remains unchanged. The bus-line capacitance of the read/write data bus can also be appreciably reduced and there is no need in this case for, in particular, any change in the size of the individual memory sectors, because the bus-line capacitance is dependent simply on the length of a memory sector in the case of the solution according to the invention whereas in the prior art shown in FIG. 2 the bus-line capacitance depends on the length of at least two memory sectors arranged next to one another and on the space between the two memory sectors.

All in all, it is thus possible to achieve an appreciable reduction in the total bit-line capacitance with the help of the present invention, this also resulting in an appreciable reduction in current consumption because the current required to charge the bit-line capacitance, i.e. the charge required for this purpose per unit of time, is proportional to the bit-line capacitance. Also, no increase in the area occupied is required for the implementation of the present invention because the area needed for all the sense amplifiers in the case of the present invention is approximately equally as large as in the case of the prior art shown in FIG. 2.

For a 72 kB memory for example, with the sector size maintained, it has been possible to achieve a reduction in data-bus line capacitance of approx. 40–45% and hence a reduction in total bit-line capacitance of approx. 33%. At the same time, current consumption was lowered by approx. 100 $\mu A$, which is a great advantage in low-power applications.

Although the present invention can preferably be used in non-volatile memories, and particularly in EEPROM or flash memories, the present invention is not of course limited to this preferred field of application and is independent of the type of memory used in the given case.

The present invention is explained in detail below by reference to the accompanying drawings and a preferred embodiment.

Figure 1:
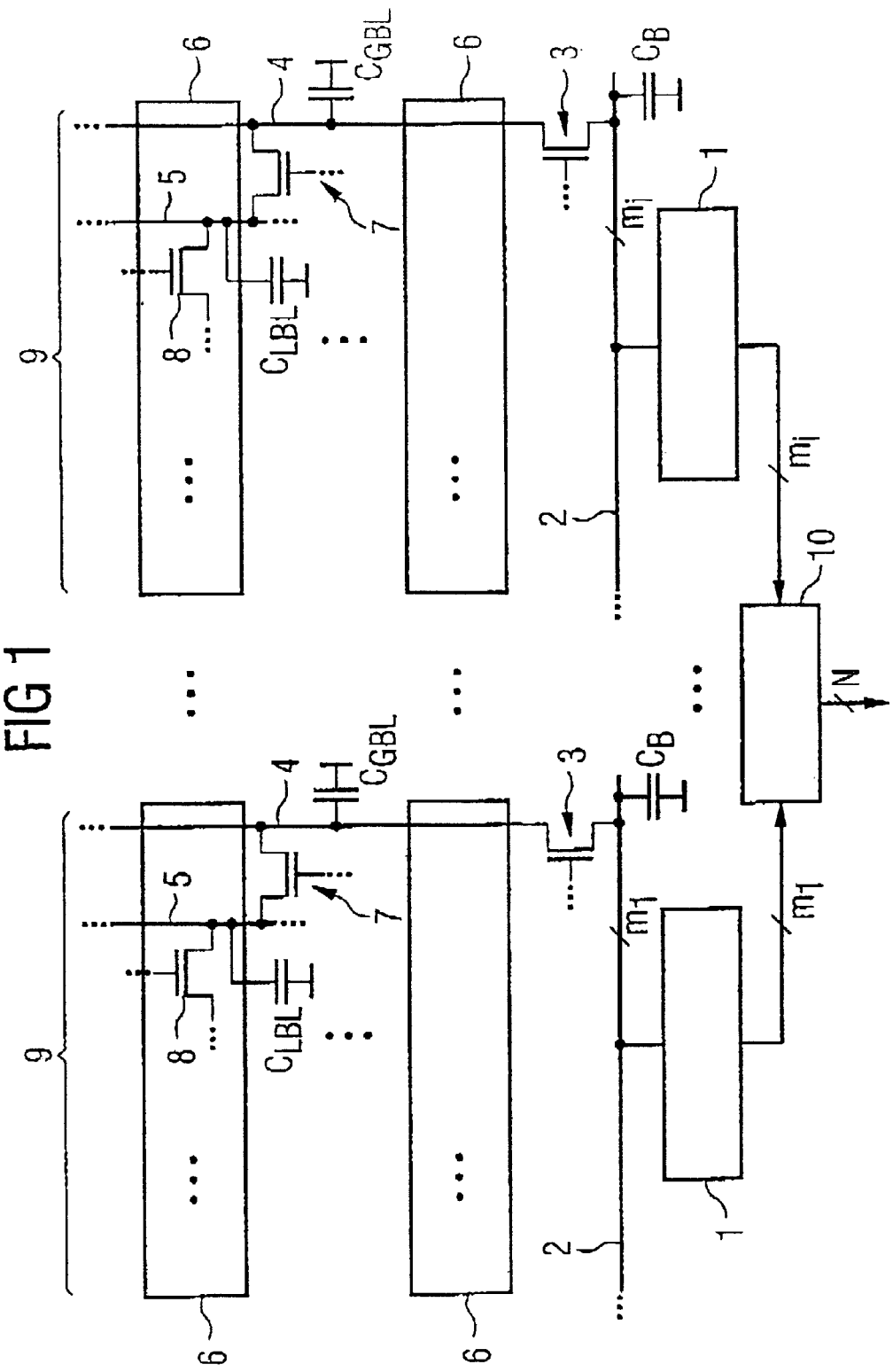

FIG. 1 is a schematic view to allow the architecture of a semiconductor memory arrangement according to the present invention to be explained, and FIG. 2 is a schematic view to allow the architecture of a prior-art semiconductor memory arrangement to be explained.

In the embodiment shown in FIG. 1, the semiconductor memory arrangement is divided into a large number n of memory blocks 9, a corresponding data bus 2 comprising $m_i$ bits and a group of $m_i$ sense amplifiers connected to this data bus 2 being provided for each memory block no.i. Via a data line in the corresponding data bus 2 and an electronically controllable switch 3, which is in the form of a switching transistor in the present case, each sense amplifier 1 can be connected to a global bit line 4 which is provided as common to a plurality of memory sectors 6. Each global bit line 4 can be connected via other controllable switches 7 to corresponding local bit lines 5 belonging to the individual memory sectors 6, the local bit lines 5 being connected in turn directly to corresponding storage locations 8.

The individual memory sectors 6 are arranged in rows and columns as a matrix, with each memory block 9 being associated with one column of the semiconductor memory arrangement.

The way in which the semiconductor memory arrangement shown in FIG. 1 operates is thus not substantially different from the way in which the semiconductor memory arrangement shown in FIG. 2 operates, and for further information on this point reference may therefore be made to what was said in connection with FIG. 2.

However, the essential difference between the semiconductor memory arrangements shown in FIG. 1 and FIG. 2 lies in the fact that in FIG. 1 each memory block has a data bus 2 with a bit-width of only $m_i$ bits, and hence a group of $m_i$ sense amplifiers 1, associated with it, thus making it possible to achieve an appreciable reduction in the bus-line capacitance $C_B$ in comparison with FIG. 2 because in FIG. 1 the bus-line capacitance $C_B$ depends simply on the length of a memory sector 6, whereas in the semiconductor memory arrangement shown in FIG. 2 the bus-line capacitance $C_B$ depends on two or more memory sectors 6 arranged next to one another and on the spaces arranged between them (in FIG. 1 each memory block 9 has only one memory sector 6 in the widthwise direction).

The individual data buses 2 and the individual groups of sense amplifiers 1 are so selected that the following equation applies:

$$\sum_{i=1}^{n} m_i = N$$

In this equation, n is the number of memory blocks 9, i.e. the number of individual data buses and the number of individual groups of sense amplifiers 1, whereas N is the total number of bits to be read out in parallel. By combining the output signals from all the sense amplifiers 1 by means of a suitable combining circuit 10 it is thus possible to obtain an N-bit output signal in a similar way to what is shown in FIG. 2.

The number $m_i$ of data lines in the individual data buses 2, or in other words the number $m_i$ of sense amplifiers 1 in the individual sense amplifier groups may vary from memory block to memory block. However, where the storage density in each memory block 9 is the same, it is advisable for the semiconductor memory arrangement to be symmetrically or regularly divided, which means that the number ml of sense amplifiers 1 required for each memory block 9 will be the same and the following equation will therefore apply:

$m_i = N/n.$

What is claimed is:

1. Semiconductor memory arrangement having a plurality of memory sectors, the storage locations in each memory sector being connectable to a global bit line via a local bit line, and having a plurality of sense amplifiers, each sense amplifier being connectable via a data bit to one of the global bit lines, wherein the sense amplifiers are combined into a plurality of groups of sense amplifiers, the sense amplifiers in each group being connectable to a corresponding global bit line via a data bus associated with the given group, wherein the data bus number i is a data bus comprising $m_i$ bits and the group of sense amplifiers associated with data bus number i comprises $m_i$ sense amplifiers, the individual data buses and the individual groups of sense amplifiers being so designed, to allow a total of N bits to be read out from the semiconductor memory arrangement, that $$\sum_{i=1}^{n} m_i = N$$

is true, where n is the number of data buses, i.e. the number of groups of sense amplifiers.

2. Semiconductor memory arrangement according to claim 1, wherein the number $m_i$ is the same for all the data buses and for all the groups of sense amplifiers, so that $m_i = N/n$ is true in each case.

3. Semiconductor memory arrangement according to claim 1, wherein each sense amplifier in a group of sense amplifiers can be connected to the corresponding global bit line via a data line in the corresponding data bus and via a controllable switch.

4. Semiconductor memory arrangement according to claim 1, wherein the semiconductor memory arrangement is part of a non-volatile semiconductor memory.

5. Semiconductor memory arrangement having a plurality of memory sectors, the storage locations in each memory sector being connectable to a global bit line via a local bit line, and having a plurality of sense amplifiers, each sense amplifier being connectable via a data bus to one of the global bit lines, wherein the sense amplifiers are combined into a plurality of groups of sense amplifiers, the sense amplifiers in each group being connectable to a corresponding global bit line via a data lines associated with the given group, wherein the individual memory sectors in the semiconductor memory arrangement are arranged in rows and columns in a matrix, and the memory sectors a column of the semiconductor matrix arrangement are connected together by at least one global bit line.

6. Semiconductor memory arrangement according to claim 5, wherein each sense amplifier in a group of sense amplifiers can be connected to the corresponding global bit line via a data line in the corresponding data bus and via a controllable switch.

7. Semiconductor memory arrangement according to claim 5, wherein each data bus and each group of sense amplifiers are associated with the memory sectors arranged in a column of the semiconductor memory arrangement.

8. Semiconductor memory arrangement according to claim 5, wherein the semiconductor memory arrangement is part of a non-volatile semiconductor memory.

* * * * *